United States Patent [19]
Chaudhary

[11] Patent Number: 5,889,411
[45] Date of Patent: Mar. 30, 1999

[54] FPGA HAVING LOGIC ELEMENT CARRY CHAINS CAPABLE OF GENERATING WIDE XOR FUNCTIONS

[75] Inventor: Kamal Chaudhary, Milpitas, Calif.

[73] Assignee: Xilinx, Inc., San Jose, Calif.

[21] Appl. No.: 815,027

[22] Filed: Mar. 14, 1997

Related U.S. Application Data

[63] Continuation-in-part of Ser. No. 806,997, Feb. 26, 1997.

[51] Int. Cl.$^6$ .............................................. H03K 19/177
[52] U.S. Cl. ............................................. 326/39; 326/41
[58] Field of Search ................................ 326/39, 40, 41, 326/93, 38, 46

[56] References Cited

U.S. PATENT DOCUMENTS

| | | |
|---|---|---|
| Re. 34,363 | 8/1993 | Freeman . |
| 4,124,899 | 11/1978 | Birkner et al. .......................... 364/716 |
| 4,642,487 | 2/1987 | Carter . |
| 4,706,216 | 11/1987 | Carter . |
| 4,750,155 | 6/1988 | Hsieh ...................................... 365/203 |

(List continued on next page.)

FOREIGN PATENT DOCUMENTS

| | | |
|---|---|---|
| 2 295 738 A | 6/1996 | Br. Indian Ocean Ter. . |
| 0451798A2 | 4/1991 | European Pat. Off. . |
| 0461798A2 | 6/1991 | European Pat. Off. . |
| 0 630 115 A2 | 12/1994 | European Pat. Off. . |
| 0746107A2 | 12/1996 | European Pat. Off. . |
| 0748049A2 | 12/1996 | European Pat. Off. . |
| 2300951 | 11/1996 | United Kingdom . |
| WO 93/05577 | 8/1992 | WIPO . |
| WO9410754 | 5/1994 | WIPO . |
| 4,758,745 | 7/1988 | Elgamal et al. . |
| 4,821,233 | 4/1989 | Hsieh ...................................... 365/203 |
| 4,870,302 | 9/1989 | Freeman . |
| 5,001,368 | 3/1991 | Cliff et al. ............................... 307/465 |

OTHER PUBLICATIONS

"The Programmable Logic Data Book", 1996, available from Xilinx Inc., 2100 Logic Drive, San Jose, California, 95124, pp. 4–1 to 4–49.

Neil H. W. Weste and Klamran Eshraghian, "Principles of CMOS VLSI: A Systems Approach", by AT&T Bell Laboratories, Inc, published by Addison–Wesley Publishing Company, copyright 1985, pp. 56.

"The Programmable Gate Array Data Book", 1989, available from Xilinx Inc., 2100 Logic Drive, San Jose, California, 95124, pp. 6–30 through 6–44.

"The Programmable Logic Data Book", 1993, available from Xilinx Inc., 2100 Logic Drive, San Jose, California, 95124 pp. 1–1 through 1–7; 2–1 through 2–42; 2–97 through 2–130; and 2–177 through 2–204.

Luis Morales, "Boundary Scan in XC4000 Devices", XAPP 017.001, Oct. 1992, pp. 2–108 and 2–180.

Xilinx, Inc., "The Programmable Logic Data Book"1996, available from Xilinx, Inc., 2100 Logic Drive, San Jose, CA 95124, pp. 4–11 to 4–23 and 4–32 to 4–37.

Lucent Technologies Microelectronics Group, ORCA, "Field–Programmable Gate Arrays Data Book," Oct. 1996, pp. 2–9 to 2–20.

Altera Corporation, "Flex 10K Embedded Programmable Logic Family Data Sheet" from the Altera Digital Library, 1996, available from Altera Corporation, 2610 Orchard Parkway, San Jose, CA 95134–2020, pp. 31–53.

*Primary Examiner*—Michael Tokar
*Assistant Examiner*—Qui Van Duong
*Attorney, Agent, or Firm*—Edel M. Young

[57] ABSTRACT

An aspect of the invention provides an FPGA interconnect and logic block structure preferably included in an array of identical tiles. By allowing the complement of a carry multiplexer input signal to be another carry multiplexer input signal, an optional inverter can be formed and a carry chain running from one tile to the next can be used for generating wide XOR functions as well as other combinational functions and arithmetic functions.

5 Claims, 10 Drawing Sheets

U.S. PATENT DOCUMENTS

| | | | |
|---|---|---|---|
| 5,073,729 | 12/1991 | Greene et al. . | |
| 5,079,451 | 1/1992 | Gudger et al. | 307/465 |
| 5,122,685 | 6/1992 | Chan et al. | 307/465 |
| 5,144,166 | 9/1992 | Camarota et al. . | |
| 5,148,390 | 9/1992 | Hsieh | 365/95 |
| 5,157,618 | 10/1992 | Ravindra et al. | 364/490 |
| 5,185,706 | 2/1993 | Agrawal et al. | 364/489 |
| 5,198,705 | 3/1993 | Galbraith et al. | 307/465 |
| 5,208,491 | 5/1993 | Ebeling et al. . | |
| 5,231,588 | 7/1993 | Agrawal et al. | 364/489 |
| 5,241,224 | 8/1993 | Pedersen et al. | 307/465 |
| 5,243,238 | 9/1993 | Kean . | |
| 5,245,227 | 9/1993 | Furtek et al. | 307/465 |
| 5,258,668 | 11/1993 | Cliff | 307/465 |
| 5,260,610 | 11/1993 | Pedersen et al. . | |
| 5,260,611 | 11/1993 | Cliff et al. . | |
| 5,260,881 | 11/1993 | Agrawal et al. . | |
| 5,267,187 | 11/1993 | Hsieh et al. . | |
| 5,280,202 | 1/1994 | Chan | 307/465 |
| 5,313,119 | 5/1994 | Cooke et al. | 307/465.1 |
| 5,317,209 | 5/1994 | Garverick et al. | 307/465 |
| 5,319,255 | 6/1994 | Garverick et al. | 307/272.3 |
| 5,323,069 | 6/1994 | Smith, Jr. | 307/465 |
| 5,333,279 | 7/1994 | Dunning | 395/325 |
| 5,343,406 | 8/1994 | Freeman et al. | 364/490 |
| 5,347,519 | 9/1994 | Cooke et al. | 371/22.2 |
| 5,349,250 | 9/1994 | New . | |
| 5,357,153 | 10/1994 | Chiang et al. . | |
| 5,359,242 | 10/1994 | Veenstra | 307/465 |
| 5,365,125 | 11/1994 | Goetting et al. . | |
| 5,455,525 | 10/1995 | Ho et al. . | |
| 5,457,410 | 10/1995 | Ting . | |
| 5,469,003 | 11/1995 | Kean . | |
| 5,481,206 | 1/1996 | New et al. | 326/38 |
| 5,500,609 | 3/1996 | Kean | 326/41 |
| 5,504,440 | 4/1996 | Sasaki | 326/39 |
| 5,537,057 | 7/1996 | Leong et al. | 326/41 |
| 5,543,732 | 8/1996 | McClintock et al. | 326/41 |
| 5,546,018 | 8/1996 | New et al. | 326/38 |
| 5,546,596 | 8/1996 | Geist | 395/200.02 |
| 5,581,199 | 12/1996 | Pierce et al. . | |
| 5,583,450 | 12/1996 | Trimberger et al. | 326/41 |
| 5,629,886 | 5/1997 | New . | |
| 5,635,851 | 6/1997 | Tavana | 326/27 |
| 5,645,546 | 7/1997 | Bertolet et al. | 326/39 |
| 5,682,107 | 10/1997 | Tavana et al. | 326/41 |
| 5,724,276 | 3/1998 | Rose et al. | 364/716.06 |
| 5,740,069 | 4/1998 | Agrawal et al. | 326/47 |
| 5,760,604 | 6/1998 | Pierce et al. | 326/39 |

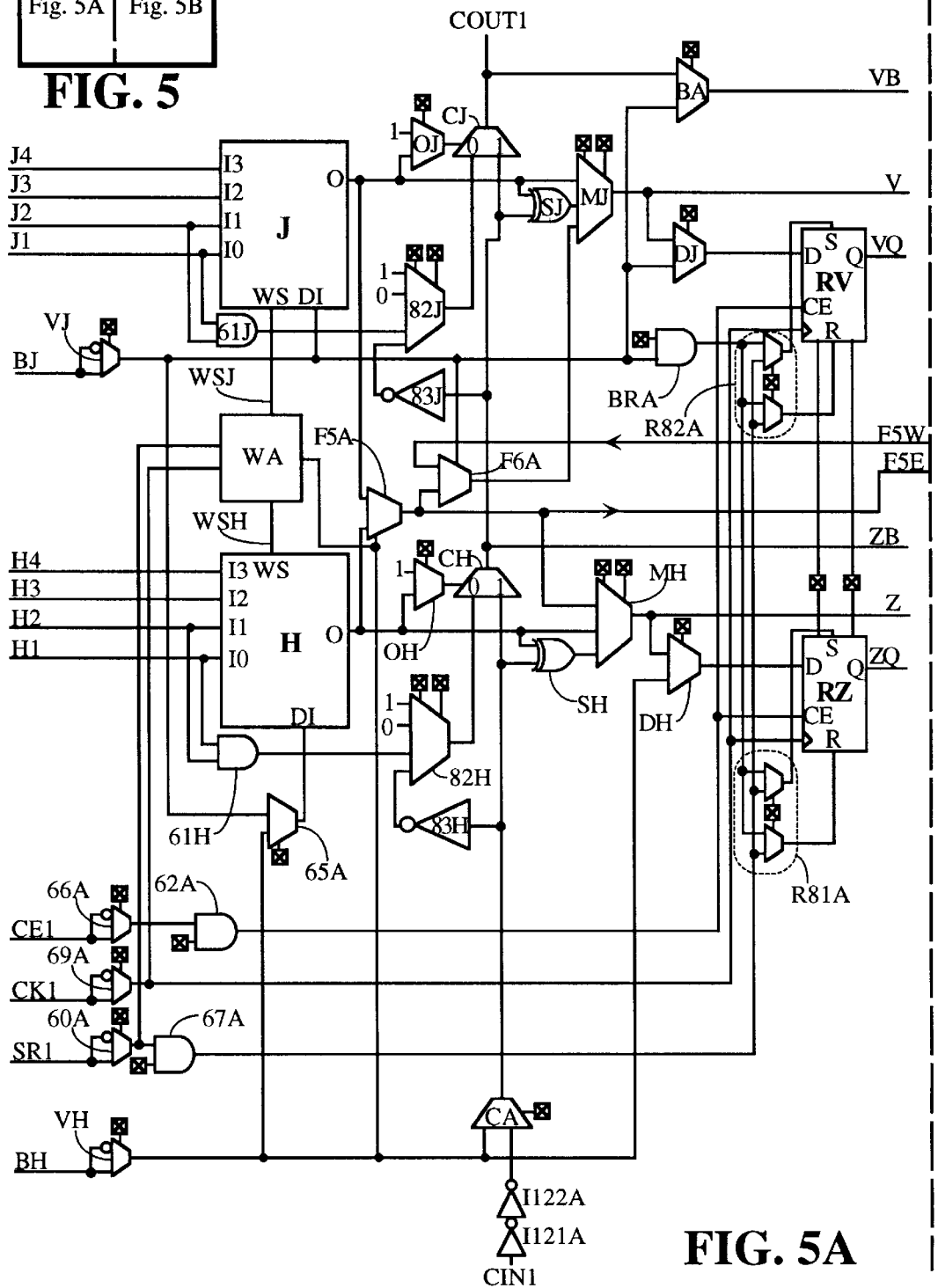

FPGA HAVING LOGIC ELEMENT CARRY CHAINS CAPABLE OF GENERATING WIDE XOR FUNCTIONS

CROSS-REFERENCE TO RELATED APPLICATIONS

This is a continuation-in-part of U.S. patent application Ser. No. 08/806,997 [docket X-277] invented by Young, Chaudhary, and Bauer, and filed Feb. 26, 1997 which is incorporated herein in its entirety by reference.

This application relates to the following commonly assigned co-pending U.S. patent applications:

1. Ser. No. 08/618,445 [docket M-2257-1N-1F US] invented by Danesh Tavana, Wilson K. Yee, and Victor A. Holen entitled "FPGA ARCHITECTURE WITH REPEATABLE TILES INCLUDING ROUTING MATRICES AND LOGIC MATRICES" and filed Mar. 19, 1996,
2. Ser. No. 08/786,818 [docket X-158 US] invented by Kenneth D. Chapman and Steven P. Young, entitled "CONFIGURABLE LOGIC BLOCK WITH AND GATE FOR EFFICIENT MULTIPLICATION IN FPGAs" and filed Jan. 21, 1997,
3. Ser. No. 08/754,421 [docket X-275 US] invented by Trevor J. Bauer, entitled "LOOKUP TABLES WHICH DOUBLE AS SHIFT REGISTERS" and filed Nov. 22, 1996, and
4. Ser. No. 08/494,131 [docket M-2565-2P US] invented by Bernard J. New, entitled "METHOD AND STRUCTURE FOR PROVIDING FAST PROPAGATION OF A CARRY SIGNAL IN A FIELD PROGRAMMABLE GATE ARRAY" and filed Jun. 23, 1995, all of which are incorporated herein by reference.

FIELD OF THE INVENTION

The invention relates to programmable integrated circuit devices, more particularly to logic elements in a field programmable logic device.

BACKGROUND OF THE INVENTION

Field programmable gate arrays (FPGAs) include logic blocks connectable through a programmable interconnect structure. The interconnect structure typically provides for connecting each logic block to each other logic block.

Several U.S. Patents show such structures for interconnecting logic blocks in FPGAs. Freeman in U.S. Reissue Patent Re 34,363, Carter in U.S. Pat. No. 4,642,487, Greene et al in U.S. Pat. No. 5,073,729, Kean in U.S. Pat. No. 5,469,003, Pierce et al in U.S. Pat. No. 5,581,199 and pages 4-32 through 4-37 of the Xilinx 1996 Data Book entitled "The Programmable Logic Data Book", available from Xilinx, Inc., 2100 Logic Drive, San Jose, Calif. 95124, incorporated herein by reference all describe interconnect structures. Tavana et al in commonly assigned, co-pending U.S. application Ser. No. 08/618,445 also describes a routing interconnect structure.

In addition to the routing structures discussed above, FPGAs have also included structures for performing special functions, in particular fast carry lines for connecting the carry output of one bit generated in one logic block to the carry input of the next bit generated in the next logic block, and cascade lines for allowing wide functions to be generated by combining several adjacent logic blocks. Carry structures are discussed by Hsieh et al. in U.S. Pat. No. 5,267,187 [M-1230-1F] and by New in U.S. Pat. No. 5,349,250 [M-2565]. Cascade structures are discussed by Goetting et al in U.S. Pat. No. 5,365,125 [docket M-1743-1] and by Chiang et al. in U.S. Pat. No. 5,357,153 [docket M-2183]. These patents are also incorporated herein by reference. Some of the fast carry architectures also include dedicated XOR gates for generating the sum when arithmetic functions are being implemented. The cascade architectures allow wide AND, NAND, OR, and NOR functions to be generated but do not allow wide XOR and XNOR functions to be generated. Since wide XOR and XNOR functions are desirable for such applications as parity checking and generation used widely in PCI and many other applications, it would be advantageous to be able to generate these functions as well.

SUMMARY OF THE INVENTION

According to one aspect of the invention, an FPGA logic element includes a carry chain structure and in addition includes means for optionally inverting the signal on the carry chain before supplying the signal to the next stage in the carry chain. With this optional inversion means, it is possible to program function generators along a carry chain to generate XOR or XNOR functions and logically combine the functions in successive function generators to generate XOR or XNOR functions of a selected width. The structure of the invention uses general function generators, and so can be used for doing other functions as well.

BRIEF DESCRIPTION OF THE DRAWINGS

FIG. 4 comprising

FIG. 5 comprising FIGS. 5A and 5B shows the internal logic for another embodiment of the CLE of FIG. 2.

FIG. 7, comprising

DETAILED DESCRIPTION OF THE DRAWINGS

Figure 1:
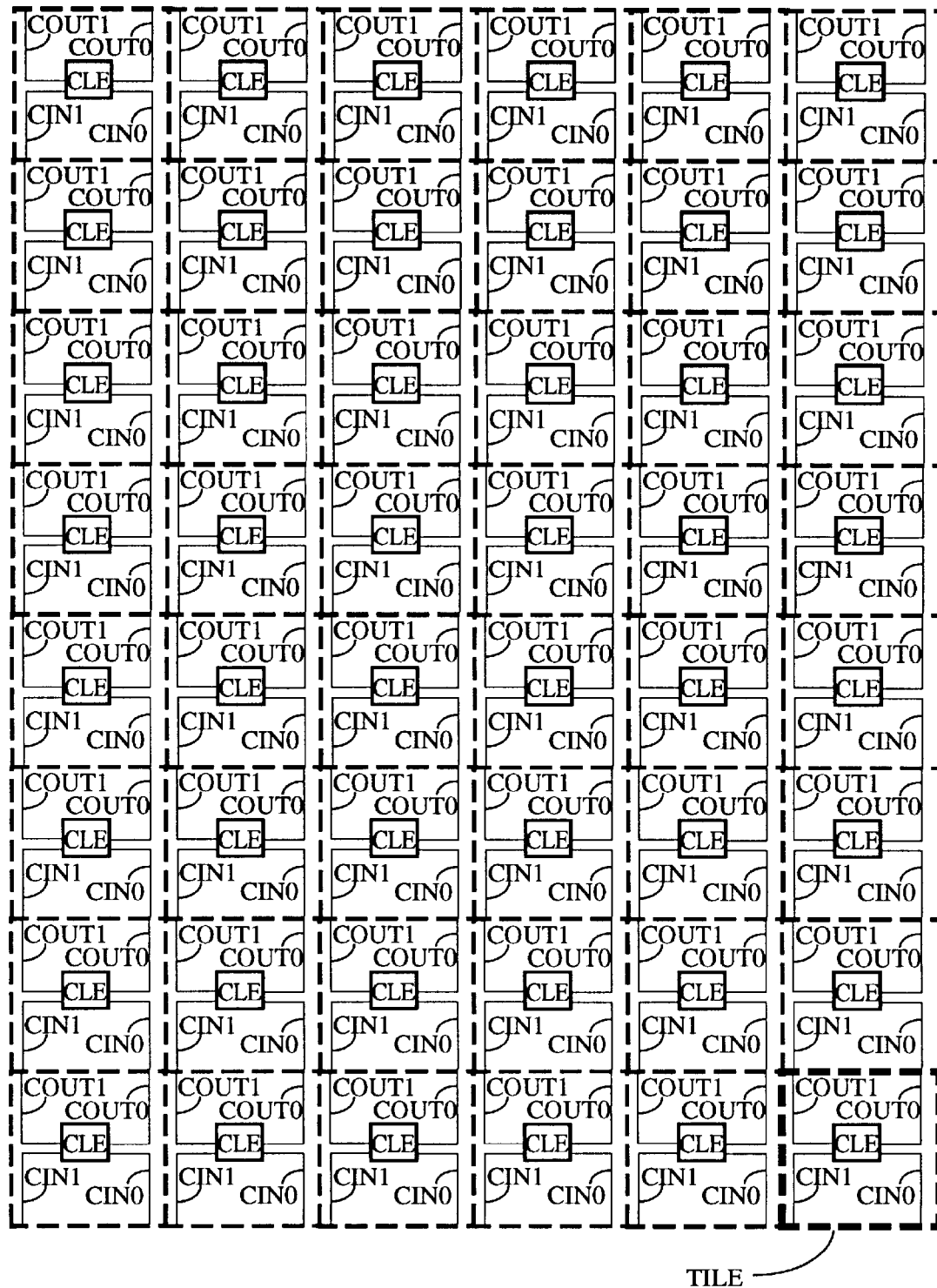
FIG. 1 shows a tile representation of an FPGA structure with carry chain structures.

FIG. 1 illustrates in simplified form an array of tiles of which one tile is labeled. In each tile is a configurable logic element CLE. Carry chains extend vertically through FIG. 1 from one tile to the next. Each CLE in FIG. 1 receives two carry-in inputs CIN0 and CIN1, and generates two carry-out outputs COUT0 and COUT1.

Figure 2:
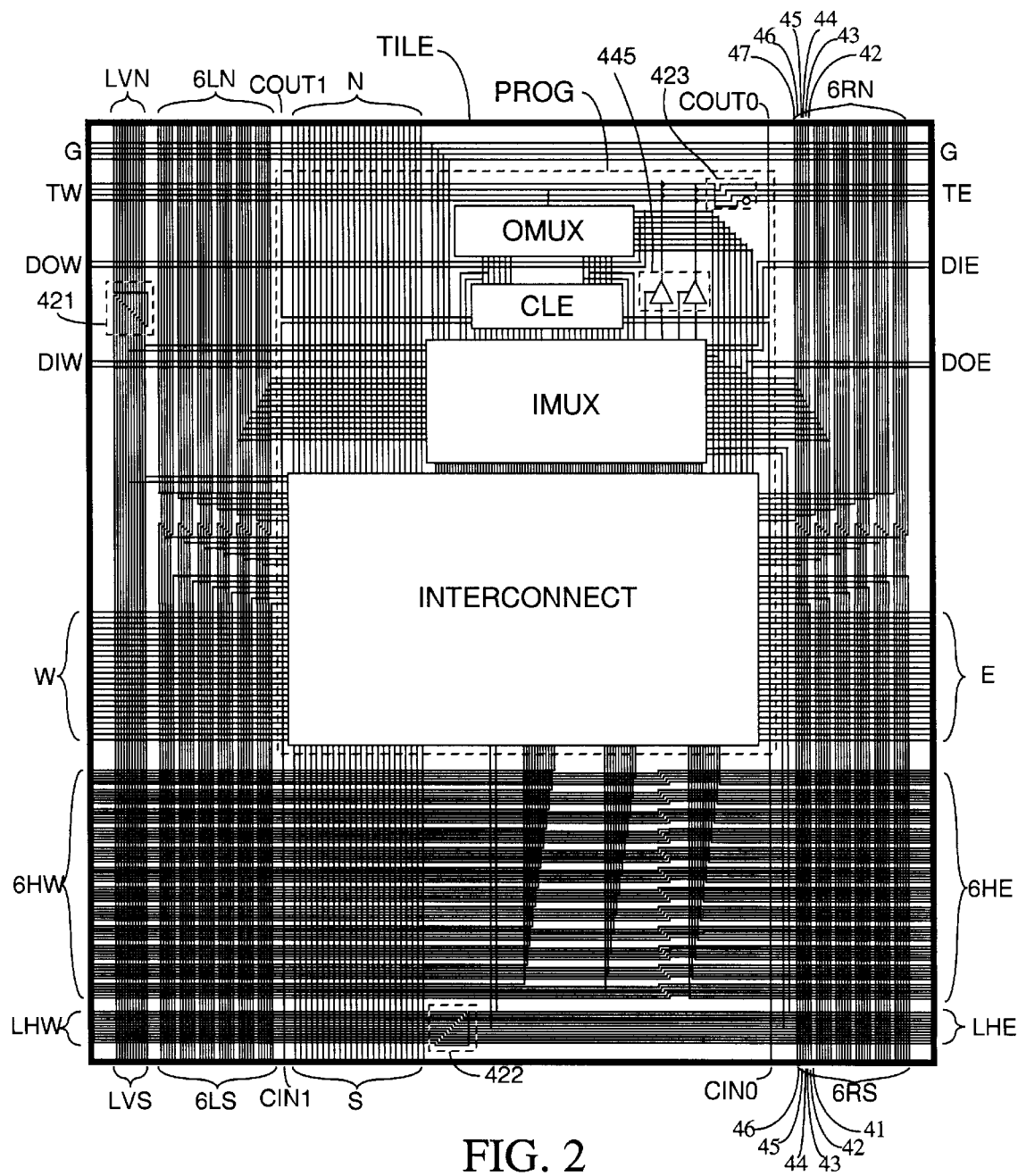
FIG. 2 shows a detailed representation of a single tile in the preferred embodiment.

FIG. 2 shows a detailed representation of a single tile in the preferred embodiment. Interconnect region INTERCONNECT of FIG. 2 allows lines entering and exiting the region to be programmably connected to each other in order to route signals through the array in a desired arrangement. Input multiplexer region IMUX makes programmable connections to lines extending from the IMUX to the configurable logic element CLE from those lines entering the IMUX but not entering the configurable logic element CLE. Output multiplexer region OMUX programmably connects lines extending from the CLE into the OMUX to lines exiting the OMUX.

Configurable Logic Element CLE

The configurable logic element CLE has left and right slices, each of which includes combinational and sequential logic portions.

Figure 3:
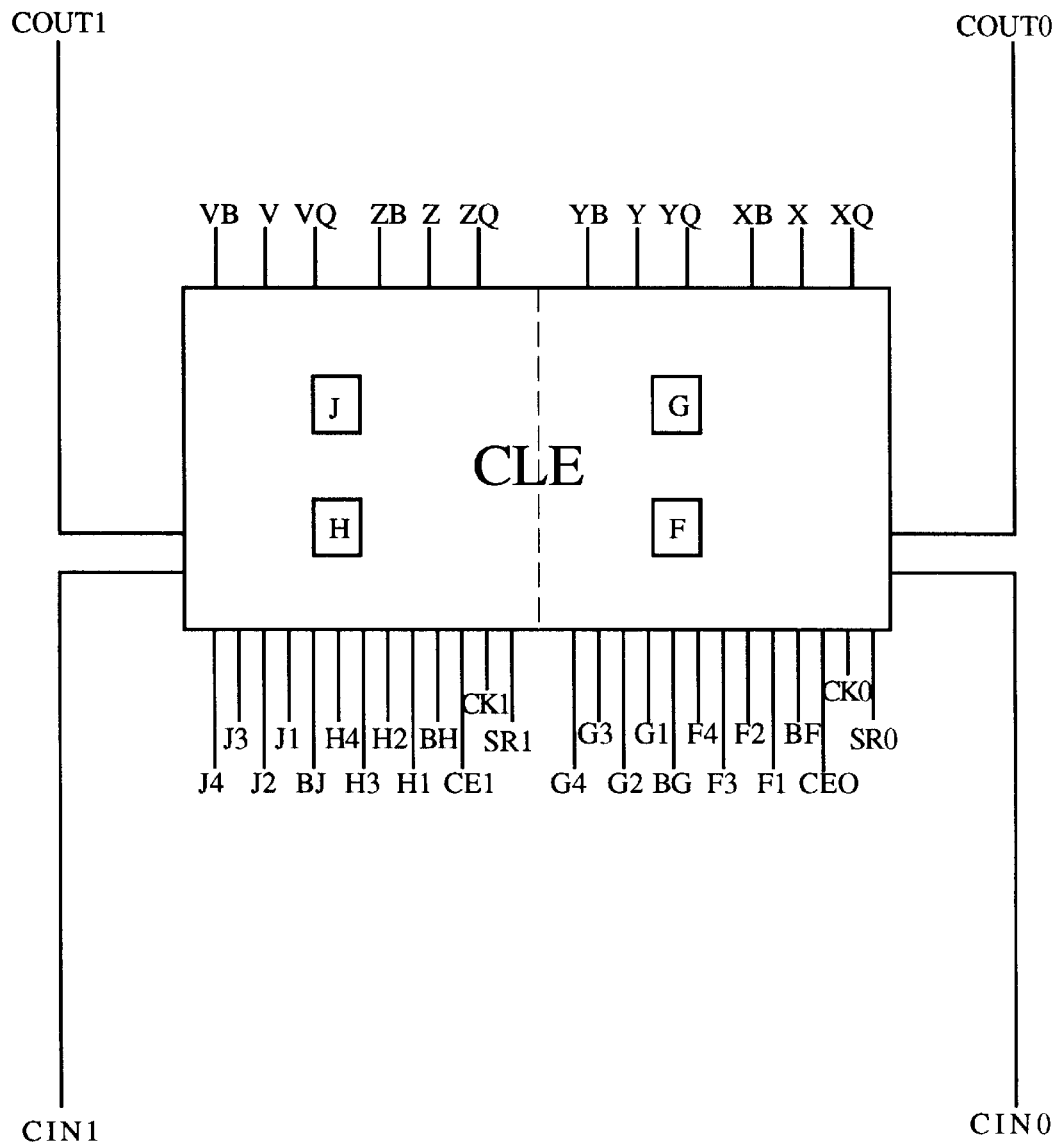
FIG. 3 shows the input and output signals for the configurable logic element (CLE) of FIG. 2.

FIG. 3 shows the input and output signals for the configurable logic element CLE of the embodiment shown in FIG. 2. Many configurable logic elements can be used with the interconnect structure of the invention. For example, pages 4-11 through 4-23 of the Xilinx 1996 Data Book entitled "The Programmable Logic Data Book", available from Xilinx, Inc., 2100 Logic Drive, San Jose, Calif. 95124, also incorporated herein by reference, describe a configurable logic element used in the XC4000 Series FPGA architecture which is compatible with the invention. Pages 4-188 through 4-190 of the same document, also incorporated herein by reference, describe yet another compatible configurable logic element, used in the XC5200 Family FPGA architecture.

Figure 4A:
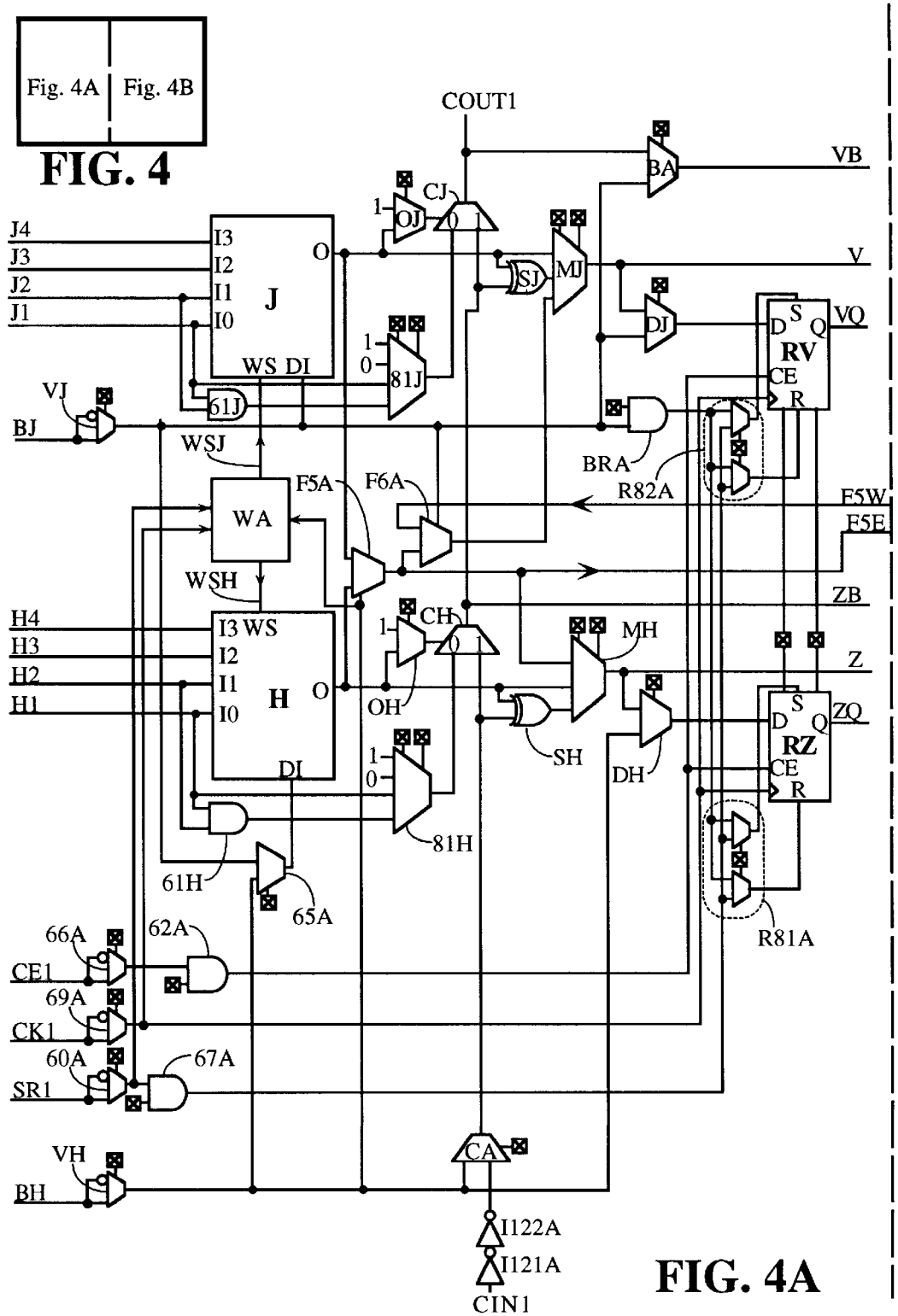
FIGS. 4A and 4B shows the internal logic for one embodiment of the CLE of FIG. 2. To view the entire CLE of FIG. 4, FIGS. 4A and 4B must be viewed together as shown in FIG. 4.
Figure 4B:
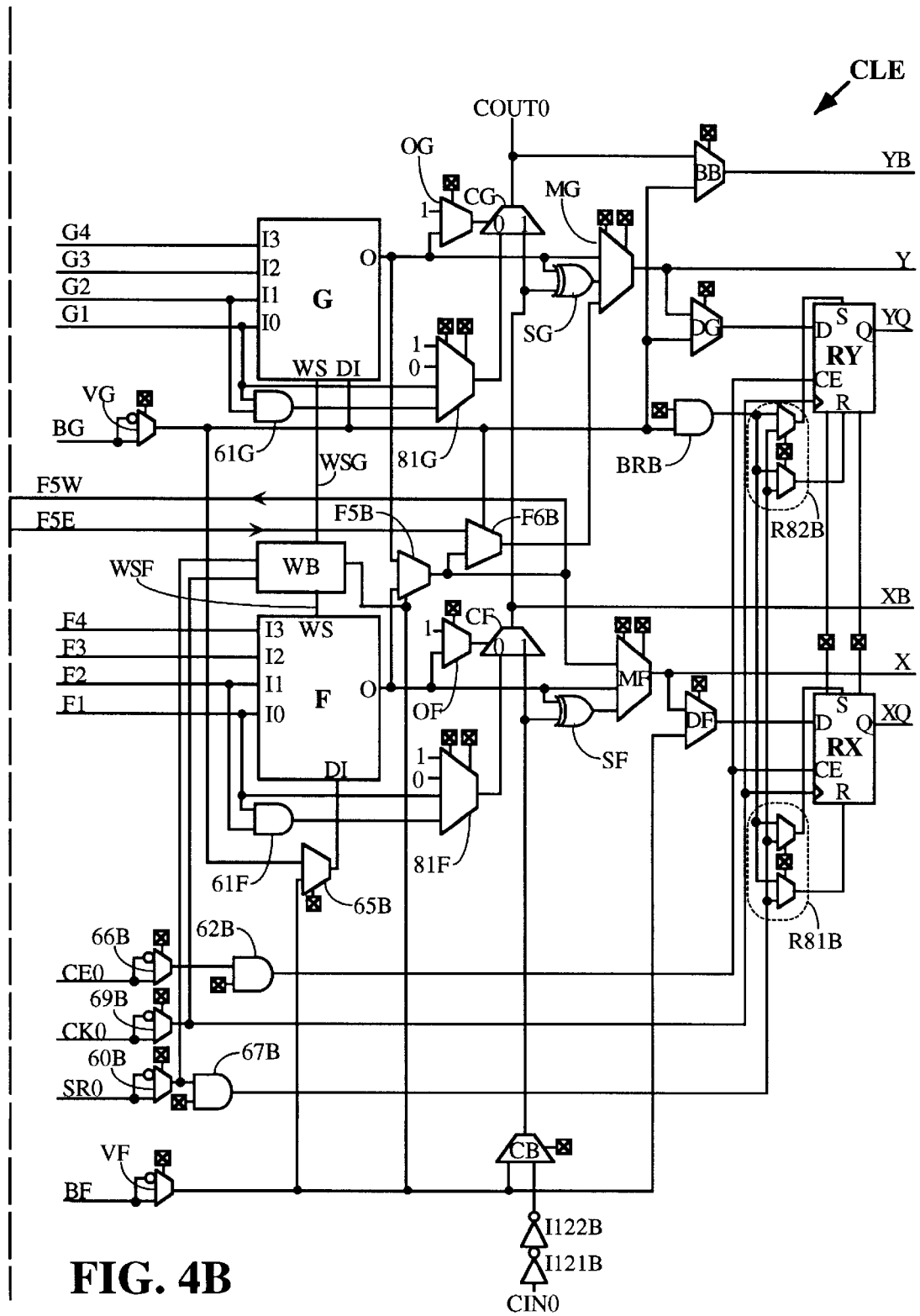

One CLE that can be used with the embodiment of FIG. 2 is shown in FIG. 4. To view the entire CLE of FIG. 4, FIGS. 4A and 4B, each showing one slice, must be viewed together. Programmable (configurable) bits controlling the function of the CLE are shown as small boxes containing an "x".

The details of one function generator compatible with the interconnect structure of the invention are shown and described in commonly assigned, co-pending U.S. application Ser. No. 08/786,818 entitled "Configurable Logic Block with AND Gate for Efficient Multiplication in FPGAs" [docket X-158] by Chapman et al, which is referenced above and incorporated herein by reference.

One CLE compatible with the interconnect structure of the invention is the CLE of FIG. 4, which includes four function generators: F and G in FIG. 4B, and H and J in FIG. 4A. Function generator F has four inputs F1, F2, F3, F4; function generator G has four inputs G1, G2, G3, G4; function generator H has four inputs H1, H2, H3, H4; and function generator J has four inputs J1, J2, J3, J4. Each of function generators F, G, H, J also has a data-in input DI and an output O. In addition, each function generator F, G has a write strobe WS input WSF, WSG, respectively, generated in write strobe generator WB from clock input signal CK0 optionally inverted by multiplexer 69B, set/reset input signal SR0 optionally inverted by multiplexer 60B, and input signal BF optionally inverted by multiplexer VF. Each function generator H, J has a write strobe WS input WSH, WSJ, respectively, generated in write strobe generator WA from clock input signal CK1 optionally inverted by multiplexer 69A, set/reset input signal SR1 optionally inverted by multiplexer 60B, and input signal BH optionally inverted by multiplexer VH. Function generators F, G, H, J of FIG. 4 preferably include novel features described by Bauer in commonly assigned, co-pending U.S. patent application Ser. No. 08/754,421 entitled "Lookup Tables Which Double as Shift Registers", which is referenced above and incorporated herein by reference. Briefly, these function generators have the ability to operate as shift registers as well as small RAMs and lookup tables. Write strobe signal WS controls the shifting function and the RAM write cycle. (In one embodiment, write strobe signal WS is implemented as two separate control signals, as described by Bauer.) Data-in port DI carries a data signal (in this embodiment derived from input signals BF, BH, BG, BJ) for writing to an addressed memory cell. When function generators F, G, H, J are configured as shift registers as described by Bauer, the shift register data input signal is taken from BF, BC, BH, BJ, respectively. Write strobe generators WB, WA generate write strobe signals WSF and WSG, WSH and WSJ, respectively. Signals WSF, WSG, WSH, WSJ strobe data into their respective function generators during a write cycle when the function generators are configured as RAM, and cause a shift when the function generators are configured as shift registers. The use of function generators as RAM is described in pages 4-11 through 4-23 of the Xilinx 1996 Data Book entitled "The Programmable Logic Data Book", referenced above and incorporated herein by reference.

The function generator of this embodiment can therefore be configured as a look-up table, a shift register, a 16×1 RAM, half of a 16×1 dual-ported RAM (when the two function generators in a slice are paired together), half of a 16×2 RAM, or half of a 32×1 RAM (when the two function generators in a slice are paired together). Not all combinations of function generator configurations are supported in a single slice. The supported combinations are detailed below.

In this embodiment, write strobe signals WSF and WSG are controlled by write strobe generator WB. A high (logic 1) pulse on function generator input WS causes a write to occur to the function generator look-up table, to either the first memory cell of the look-up table (if configured as a shift register) or to an addressed cell (if configured as a RAM). (See commonly assigned, co-pending U.S. patent application Ser. No. 08/754,421 entitled "Lookup Tables Which Double as Shift Registers", which is referenced above and incorporated herein by reference.)

Write strobe generator WB functions as follows in the supported combinations of function generator configurations: a) when function generators F and G are both configured as look-up tables, write strobe signals WSF and WSG are held low (logic 0); b) when function generator G is configured as a 16×1 RAM or shift register and function generator F is configured as a look-up table, write strobe signal WSF remains low while write strobe signal WSG pulses high when SR0 is active (low or high, depending on whether multiplexer 60B is inverting or not) and CK0 makes the proper transition (falling or rising, depending on whether multiplexer 69B is inverting CK0 or not); c) when function generators F and G are configured as a dual-ported 16×1 RAM, a 16×2 RAM, or a pair of shift registers, write strobe signals WSF and WSG pulse high together when SR0 is active and CK0 makes the proper transition; d) when function generators F and G are configured as a single 32×1 RAM, one but not both of write strobe signals WSF and WSG pulses high, when SR0 is active and CK0 makes the proper transition. The generated high pulse occurs on write strobe signal WSF if multiplexer VF is non-inverting and input signal BF is High or if multiplexer VF is inverting and input signal BF is low, otherwise the high pulse occurs on write strobe signal WSG. As can be seen from the above description, SR0 acts as a write enable and CK0 acts as a clock to a synchronous RAM or shift register, while BF serves as a fifth address bit when the two function generators in a slice are configured as a 32-bit RAM.

Write strobe signals WSH and WSJ are generated by write strobe generator WA and controlled by input signals SR1, CK1, and BH, in a corresponding fashion.

Each slice further includes five-input-function multiplexer F5A, F5B and six-input-function multiplexer F6A, F6B. In FIG. 4A, multiplexer F6A receives an input signal on west-going line F5W from the output of multiplexer F5B in FIG. 4B. In FIG. 4B, six-input-function multiplexer F6B receives an input signal on east-going line F5E from the output of multiplexer F5A in FIG. 4A. Multiplexer F6A receives a second input signal from multiplexer F5A, and multiplexer F6B receives a second input signal from multiplexer F5B. Multiplexer F5A receives inputs from outputs O of function generators H and J. Multiplexer F5B receives inputs from outputs O of function generators F and G.

The CLE of this embodiment receives four extra control signals on lines BF, BH, BG, and BJ. These lines can be programmably inverted using multiplexers VF, VH, VG, and VJ, respectively, and control several useful functions. The five-input function multiplexers F5A, F5B are controlled by lines BH, BF, respectively. The six-input function multiplexers F6A, F6B are controlled by lines BJ, BG, respectively. A user can form a four-input multiplexer using multiplexer F5A and the outputs of function generators H and J, with function generators H and J each configured as a two-input multiplexer. Similarly, a four-input multiplexer can be formed using multiplexer F5B and the outputs of function generators F and G. A user can form an eight-input multiplexer using either multiplexer F6A or multiplexer F6B receiving inputs from both multiplexers F5A and F5B, each of which is receiving outputs from its respective function generators. Further, with multiplexer F5A, the memory cells in function generators H and J can operate as a 32-bit RAM. With multiplexer F5B, the memory cells in function generators F and G can operate as a 32-bit RAM. Lines BF, BH, BG, BJ serve as multiplexer control lines or RAM address lines, in addition to other functions as later described.

Registers RX, RY, RZ, RV generate outputs XQ, YQ, ZQ, VQ, respectively. Clock inputs to registers RX, RY, RZ, RV are designated by open triangles with apexes pointing into these registers. Clock enable inputs CE can be disabled using AND-gates 62A, 62B. (AND-gates 62A, 62B are controlled by a programmable memory cell that provides one of the inputs to each AND-gate.) Registers RX, RY, RZ, RV can be set or reset either synchronously or asynchronously through set port S or reset port R. (The choice of synchronous or asynchronous is made by a programmable memory cell shared between the two registers in each slice.) Set/reset input signals SR0, SR1 are controlled by multiplexers 60A, 60B and AND-gates 67A, 67B. Inputs SR0, SR1 (if enabled by AND-gates 67A, 67B) can set or reset the registers. Set/reset control units R81B, R82B, R81A, R82A are programmably controlled to either set or reset registers RX, RY, RZ, RV, respectively. Registers RX, RY, RZ, RV can also be configured as latches, the choice being made by a programmable memory cell shared between the two registers in each slice.

XOR gates SF, SG, SH, SJ generate the sum portion of an addition or multiplication, as described in commonly assigned, co-pending U.S. patent application Ser. No. 08/754,421 entitled "Lookup Tables Which Double as Shift Registers", which is referenced above and incorporated herein by reference.

Multiplexers MF, MG, MH, MJ select between signals to place onto output lines X, Y, Z, V, respectively. Multiplexers MF and MH select between the related function generator output signal, sum output signal, and five-input function multiplexer output signal. Multiplexers MG and MJ select between the related function generator output signal, sum output signal, and six-input function multiplexer output signal. The function generator F, G, H, J output signal is selected when a logical function of up to four inputs is chosen. The five-input function multiplexer F5A, F5B output signal is selected when one of a limited set of nine-input functions is chosen, including any logical function of five inputs, a 4-to-1 multiplexer, and any other function that can be implemented as two four-input functions feeding a 2-to-1 multiplexer. The six-input function multiplexer F6A, F6B output signal is selected when one of a limited set of 18-input functions is chosen, including any logical function of six inputs, an 8-to-1 multiplexer, and any other function that can be implemented as the output of two five-input function multiplexers F5A, F5B feeding a 2-to-1 multiplexer. The sum output signal of XOR gates SF, SG, SH, SJ is selected when an appropriate arithmetic operation such as addition, subtraction or multiplication is implemented. Multiplexers OF, OG, OH, OJ allow the carry chain to bypass the related function generator. Multiplexers OF, OG, OH, OJ select whether the respective carry multiplexer CF, CG, CH, CJ is controlled by the function generator output signal O or whether the carry chain bypasses the function generator by propagating the carry-in signal to the next stage along the carry chain. Multiplexers CA, CB allow additional access onto their respective carry chains by selecting either a carry-in signal CIN0, CIN1 (buffered in this embodiment by inverters I121B and I122B, I121A and I122A, respectively) or an input signal BF, BH as the starting point for the carry chain in the CLE.

Multiplexers DF, DH select a signal to be loaded into related registers RX, RZ either from the outputs of multiplexers MF, MH, or from input signals BF, BH, respectively. Multiplexers DG, DJ select a signal to be loaded into related registers RY, RV either from the outputs of multiplexers MG, MJ, or from input signal lines BG, BJ, respectively.

Multiplexers BB, BA are bypass multiplexers that can apply carry-out signals COUT0, COUT1 to output lines YB, VB, or can forward input signals BG, BJ to output lines YB, VB to route a signal generated on one side of the CLE to a destination on the other side of the CLE.

AND-gates BRB, BRA allow input signals BG, BJ to serve as set/reset signals to registers RX, RY, RZ, RV, or alternatively allows input signals BG, BJ to be decoupled from registers RX, RY, RZ, RV so that input signals BG, BJ can be used for other purposes, such as controlling multiplexers F6B, F6A or providing a DI signal to function generators G, J, without setting or resetting the registers. A logic 0 in the memory cells controlling AND-gates BRB, BRA decouples lines BG, BJ from set/reset control units R81B, R82B, R81A, R82A; while a logic 1 in the associated memory cell enables AND-gates BRB, BRA to use the signals on BG, BJ to set or reset registers RX, RY, RZ, RV as determined by set/reset control units R81B, R82B, R81A, R82A.

Carry Chain

AND gates 61F, 61G, 61H, 61J and multiplexers 81F, 81G, 81H, 81J, CF, CG, CH, CJ implement multiplier and carry logic functions as described in commonly assigned, co-pending U.S. patent application Ser. No. 08/786,818 entitled "Configurable Logic Block with AND Gate for Efficient Multiplication in FPGAs" by Chapman et al, which is referenced above and incorporated herein by reference. In FIG. 4, each of multiplexers 81F, 81G, 81H, 81J has separate programmable memory cells that determine the multiplexer output. In another embodiment, the two multiplexers in each slice (81F and 81G, 81H and 81J) share memory cells and therefore have the same programmed functionality.

In the embodiment of FIG. 4, each slice has a separate carry chain. One carry chain is from input signal CIN0 to output signal COUT0 and incorporates the outputs of function generators F and G. The other carry chain is from input signal CIN1 to output signal COUT1 and incorporates the outputs of function generators H and J. In one embodiment, the two carry chains are implemented as described in commonly assigned, co-pending U.S. patent application Ser. No. 08/494,131 entitled "Method and Structure for Providing Fast Propagation of a Carry Signal in a Field Programmable Gate Array" by Bernard J. New, which is referenced above and incorporated herein by reference. Use of carry chains for addition is discussed by Hsieh et al. in U.S. Pat. No. 5,267,187 [M-1230-1F]. Use of the carry chain structure of FIG. 4 for multiplication is discussed by Chapman et al. in co-pending application Ser. No. 08/786,818 [docket X-158]. Use of a carry chain structure for wide OR and wide AND functions is discussed by New in U.S. Pat. No. 5,349,250 [docket M-2565], also incorporated by reference.

Wide XOR and XNOR

Figure 5B:
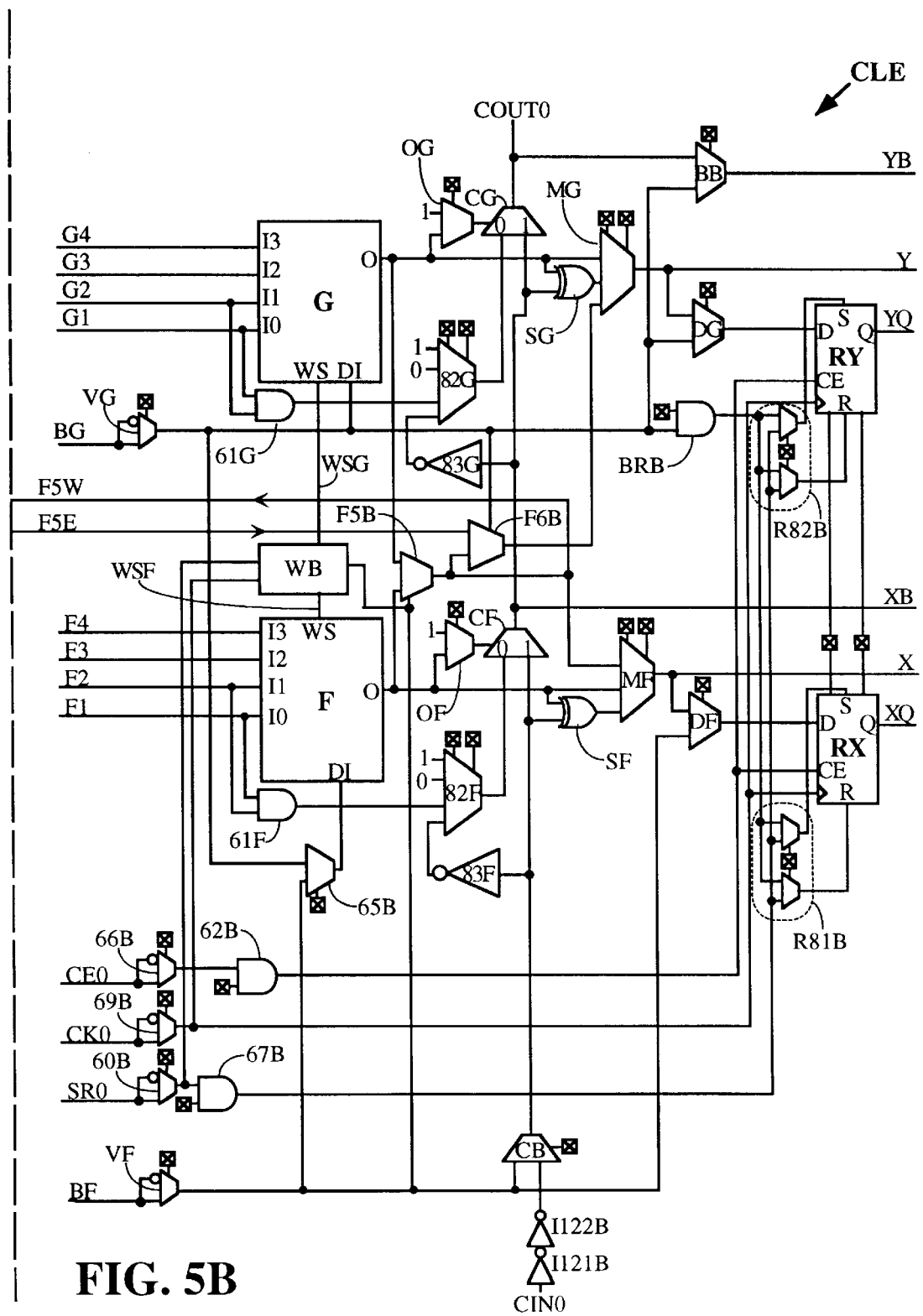

FIG. 5 (comprising FIGS. 5A and 5B) shows another CLE that can be used with the embodiment of FIG. 2. To view the entire CLE of FIG. 5, FIGS. 5A and 5B, each showing one slice, must be viewed together. Elements in FIG. 5 that correspond to elements in FIG. 4 are given the same reference numerals and are not explained again.

As a further novel feature of the invention, FIG. 5 includes multiplexers 82F, 82G, 82H, 82J, each receiving an input from a corresponding inverter 83F, 83G, 83H, 83J. In the embodiment of FIG. 5, unlike FIG. 4, no direct input from F0, G0, H0, J0 to multiplexer 82F, 82G, 82H, 82J is provided, so that multiplexer 82F, 82G, 82H, 82J is still a 4-input multiplexer and can be controlled by two memory cells. Even without the direct input of FIGS. 4A and 4B, a direct input signal to the carry chain can be provided by routing a logical 1 to one input of AND gate 61F, 61G, 61H, 61J and the direct input signal to the other AND gate input. Requiring a logical 1 on one of the function generator inputs limits the flexibility of the function generator where a carry chain starts, if this routing option is chosen. But losing a function generator input is acceptable in most cases since arithmetic functions using the carry chain typically require no more than three inputs.

In other embodiments, a third memory cell for controlling multiplexer 82F, 82G, 82H, 82J can allow for additional inputs. When multiplexer 82F, 82G, 82H, 82J is programmed to receive the inverter 83F, 83G, 83H, 83J output, carry-chain multiplexer CF, CG, CH, CJ becomes an optional inverter controlled by multiplexer OF, OG, OH, OJ, which can use the output O of function generator F, G, H, J to select between the inverted and non-inverted carry chain signal. (Optional inverters are XOR function generators because the XOR function causes the output signal to be the same as one input signal when the other input signal is low, and causes the output signal to be the inverse of the one input signal when the other input signal is high.)

In FIG. 5, because the logical 0 output signal selects the inverted carry chain signal, a wide XOR function is formed by loading XNOR truth tables into the corresponding function generators on the carry chain.

Figure 6A:
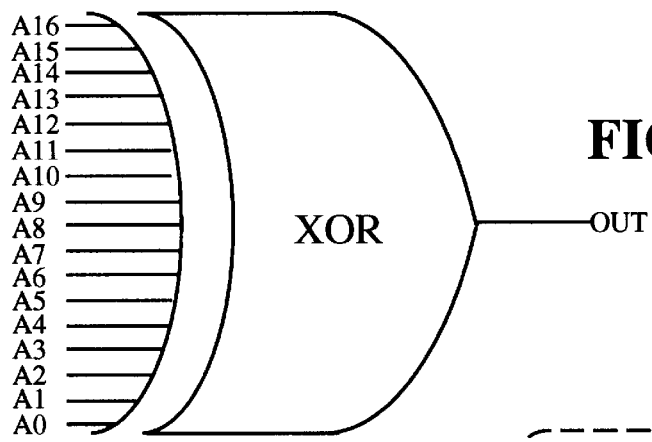
FIG. 6A shows a wide XOR gate which can be implemented by the invention.
Figure 6B:
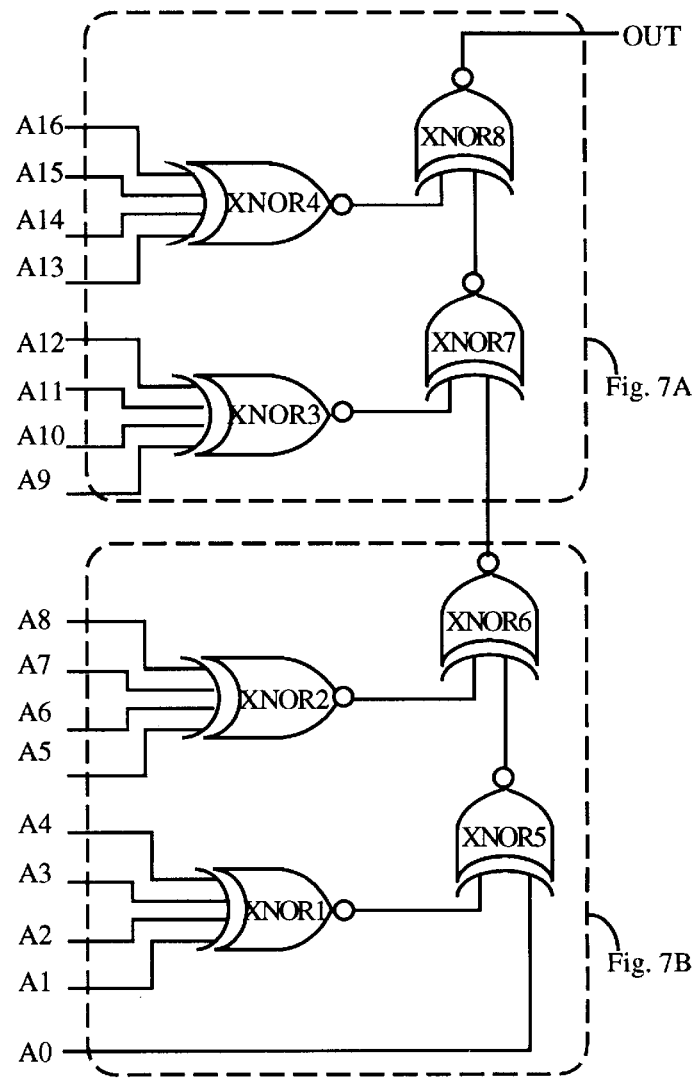
FIG. 6B shows the logical equivalent of the wide XOR gate of FIG. 6A as it will be implemented in the inventive structure.
Figure 7A:
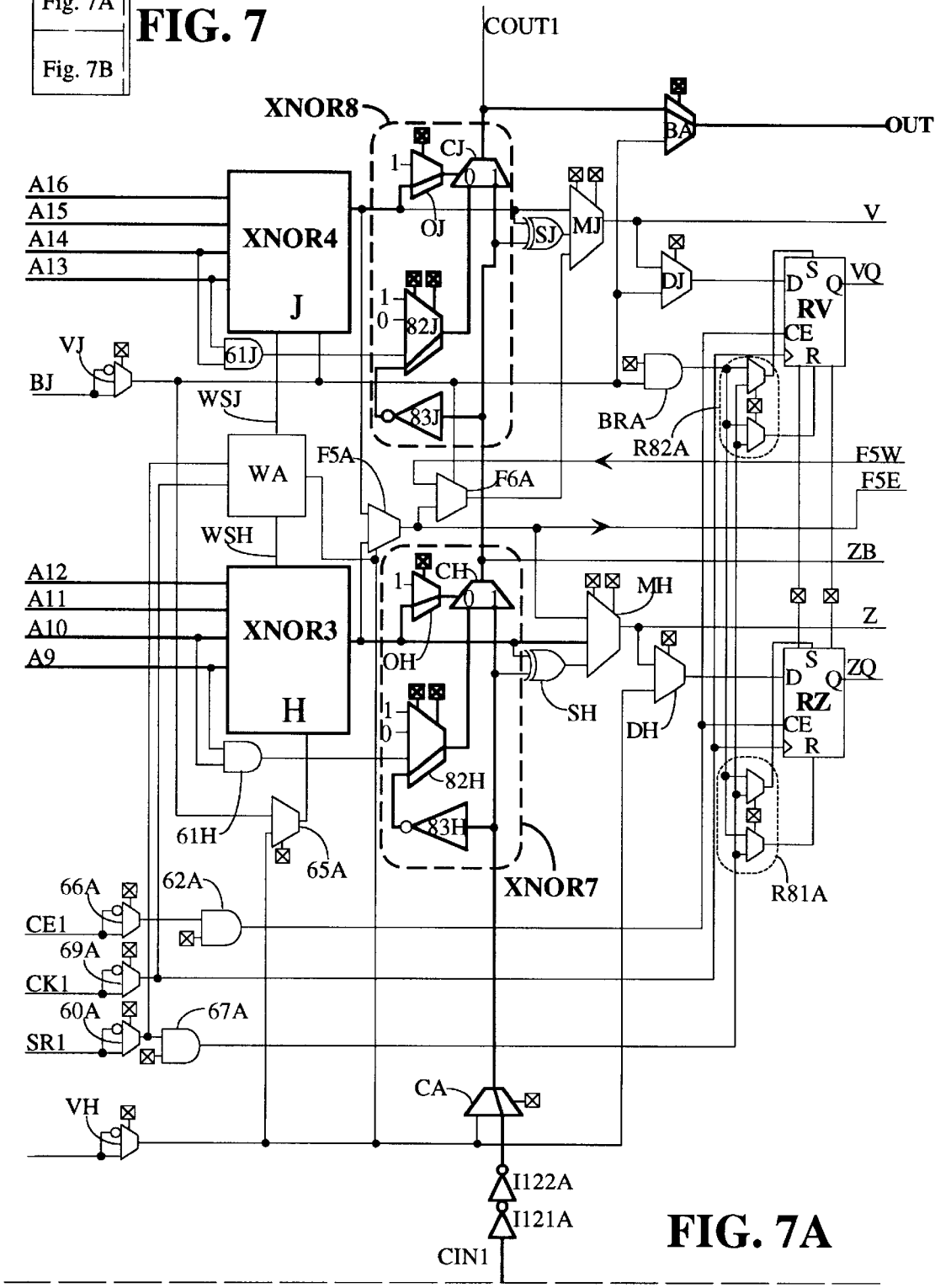
FIGS. 7A and 7B, shows structures according to the invention configured to implement the wide XOR gate of FIG. 6A.
Figure 7B:
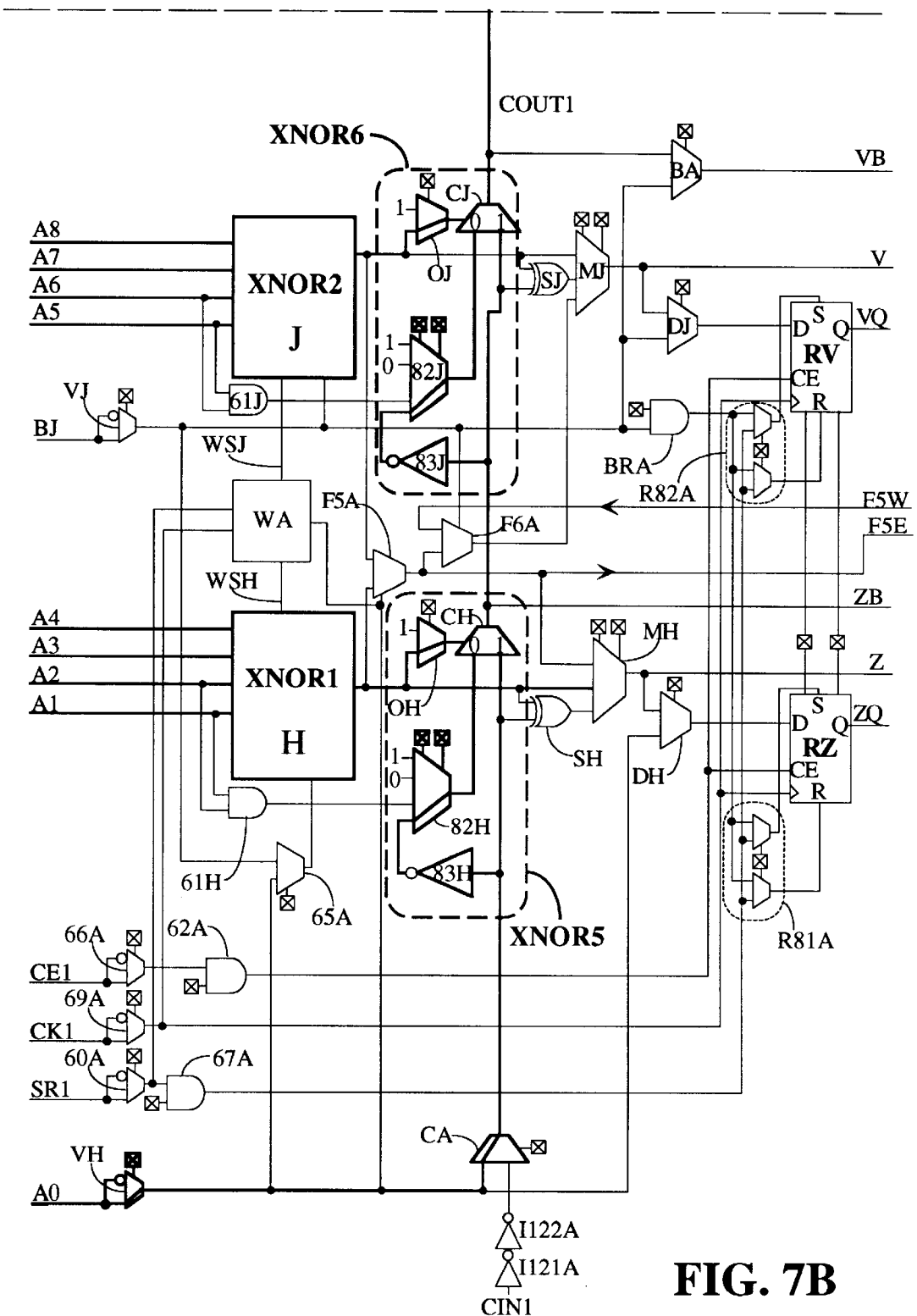

FIG. 6A shows an example application of the invention to generate a wide XOR function. A user wishes to generate the XOR function of seventeen inputs A0 through A16. This can be done in left slices of two CLBs, as shown in FIG. 6B. Four function generators will be programmed to implement XNOR functions and multiplexers associated with the carry chain will combine the inputs. FIG. 6B indicates that these XNOR functions are illustrated in FIGS. 7A and 7B. As can be seen in FIG. 1, line COUT1 from one CLE connects to line CIN1 of the next CLE.

Looking at FIG. 7, comprising FIGS. 7A and 7B, the portions of the CLE used in the present XOR example are shown in heavy lines and portions not used for generating the wide XOR function are shown in fine lines. (These other portions may still be used for other purposes, if the user's design requires.)

In FIG. 7A, multiplexers 82H and 82J are configured (by their two associated memory cells) to apply the outputs of inverters 83H and 83J to the inputs of carry multiplexers CH and CJ. Multiplexers OH and OJ are programmed by their associated memory cells to apply the outputs of their associated function generators to the control terminals of multiplexers CH and CJ. In this configuration, the structures within the dashed lines form XNOR gates XNOR5 and XNOR6. Function generators H and J are configured as XNOR gates to implement XNOR3 and XNOR4 of FIG. 6B.

In FIG. 7B, a similar configuration is set up, whereby function generators H and J implement XNOR1 and XNOR2, and the inventive carry chain structure implements XNOR5 and XNOR6. In FIG. 7A, carry-in multiplexer CA is programmed to forward carry-in signal CIN1. In FIG. 7B, carry-in multiplexer CA is configured to forward input signal A0, which is forwarded by optional inverter VH. Thus, the output signal OUT in FIG. 7A forwarded by multiplexer BA is the XOR function of the seventeen input signals A0 through A16.

Alternatively, the XNOR function may be generated by inverting an odd number of the input signals or by setting one or three of the function generators to generate the XOR function.

In summary, by adding one inverter and one multiplexer input at each stage of the carry chain, the CLE of FIG. 5 allows users to conveniently generate wide XOR and XNOR functions.

The XOR option in the carry chain need not be used only when the function generators have been loaded with XOR or XNOR truth tables. The carry chain XOR function can be used with any combination of functions in adjacent truth tables.

Those having skill in the relevant arts of the invention will now perceive various modifications and additions which may be made as a result of the disclosure herein of the preferred embodiment. Accordingly, all such modifications and additions are deemed to be within the scope of the invention, which is to be limited only by the appended claims and their equivalents.

What is claimed is:

1. An FPGA comprising:
    an array of tiles, each tile including:
        a programmable interconnect structure interconnecting adjacent tiles;
        a configurable logic block (CLE), each CLE comprising:
            at least one function generator receiving a plurality of input signals and generating at least one output signal;
            a carry multiplexer controllable by said at least one output signal, said carry multiplexer receiving as one input signal a carry-in signal from another carry multiplexer and providing as an output signal a carry-in signal to another carry multiplexer;
            means for providing as another input signal to said carry multiplexer the inverse of said carry-in signal; and
        a plurality of programmable interconnection points for connecting said programmable interconnect structure to lines for providing said input signals and to at least one line for providing said at least one output signal.

2. The FPGA of claim 1 wherein said means for providing to said carry multiplexer the inverse of said carry-in signal comprises:

a carry-chain input select multiplexer for providing another input signal to said carry multiplexer, said carry-chain input select multiplexer having a plurality of input signals, one of which is the inverse of said carry-in signal.

3. The FPGA of claim 1 wherein said carry-in signal from another carry multiplexer is taken directly from another carry multiplexer.

4. The FPGA of claim 1 wherein at least one of said programmable interconnection points can connect said output signal from said carry multiplexer to said programmable interconnect structure.

5. The FPGA of claim 1 further comprising a multiplexer for selecting between providing said carry-in signal to another carry multiplexer and providing a signal on said programmable interconnect structure to said another carry multiplexer.

* * * * *